United States Patent
Son et al.

(10) Patent No.: US 10,338,463 B2
(45) Date of Patent: Jul. 2, 2019

(54) MASK FOR PHOTOLITHOGRAPHY, METHOD OF MANUFACTURING THE SAME AND METHOD OF MANUFACTURING SUBSTRATE USING THE SAME

(71) Applicants: SAMSUNG DISPLAY CO., LTD., Yongin-si, Gyeonggi-do (KR); INDUSTRY-ACADEMIC COOPERATION FOUNDATION, YONSEI UNIVERSITY, Seoul (KR)

(72) Inventors: Yong Son, Suwon-si (KR); Min Kang, Seoul (KR); Bong-Yeon Kim, Seoul (KR); Hyun-Joo Lee, Seoul (KR); Hyang-Shik Kong, Seongnam-si (KR); Jin-Ho Ju, Seoul (KR); Kyoung-Sik Kim, Seoul (KR); Seung-Hwa Baek, Incheon (KR)

(73) Assignees: Samsung Display Co., Ltd., Yongin-si (KR); Industry-Academic Cooperation Foundation, Yonsei University, Seoul (KR)

( * ) Notice: Subject to any disclaimer, the term of this patent is extended or adjusted under 35 U.S.C. 154(b) by 109 days.

(21) Appl. No.: 15/699,955

(22) Filed: Sep. 8, 2017

(65) Prior Publication Data
US 2017/0371238 A1 Dec. 28, 2017

Related U.S. Application Data

(63) Continuation of application No. 14/752,415, filed on Jun. 26, 2015, now Pat. No. 9,778,558.

(30) Foreign Application Priority Data

Aug. 4, 2014 (KR) .................. 10-2014-0099687

(51) Int. Cl.
*G03F 1/26* (2012.01)
*G03F 1/32* (2012.01)
*G03F 1/50* (2012.01)

(52) U.S. Cl.
CPC .................. *G03F 1/26* (2013.01); *G03F 1/32* (2013.01); *G03F 1/50* (2013.01)

(58) Field of Classification Search
CPC .................. G03F 1/26; G03F 1/32; G03F 1/50
USPC .................................................. 430/5
See application file for complete search history.

(56) References Cited

U.S. PATENT DOCUMENTS

| 4,890,309 A | 12/1989 | Smith et al. |
| 7,538,858 B2 | 5/2009 | Mackey |
| 2010/0033701 A1 | 2/2010 | Lee et al. |
| 2014/0127612 A1 | 5/2014 | Kang et al. |

FOREIGN PATENT DOCUMENTS

| CN | 102096334 A | 6/2011 |
| JP | 2007-114536 A | 5/2007 |
| KR | 10-2013-0085467 A | 7/2013 |
| WO | WO 2009/094009 A1 | 7/2009 |

OTHER PUBLICATIONS

Pendry, J.B., Negative Refraction Makes a Perfect Lens, Physical Review Letters, Oct. 30, 2000, pp. 3966-3969, vol. 85, No. 18, The American Physical Society.
Fang, N. et al., Sub-Diffraction-Limited Optical Imaging with a Silver Superlens, Science, Apr. 22, 2005, pp. 534-537, vol. 308, DOI: 10.1126/science.1108759, American Association for the Advancement of Science.
EPO Search Report dated Jun. 16, 2016, for corresponding European Patent application 15170969.8, (7 pages).

*Primary Examiner* — Christopher G Young
(74) *Attorney, Agent, or Firm* — Lewis Roca Rothgerber Christie LLP

(57) ABSTRACT

A mask for photolithography includes: a transparent substrate; a phase shift pattern on the transparent substrate and configured to change a phase of light; a dielectric layer on the transparent substrate; and a negative refractive-index meta material layer on the dielectric layer.

20 Claims, 5 Drawing Sheets

MASK FOR PHOTOLITHOGRAPHY, METHOD OF MANUFACTURING THE SAME AND METHOD OF MANUFACTURING SUBSTRATE USING THE SAME

CROSS-REFERENCE TO RELATED APPLICATION

This application is a continuation of U.S. patent application Ser. No. 14/752,415, filed Jun. 26, 2015, which claims priority to and the benefit of Korean Patent Application No. 10-2014-0099687, filed on Aug. 4, 2014, the entire contents of both of which are incorporated herein by reference.

BACKGROUND

1. Field

Aspects of example embodiments of the present invention relate to a mask for photolithography, a method of manufacturing the mask, a method of manufacturing a substrate using the mask.

2. Description of the Related Art

Recently, a display apparatus having light weight and small size has been developed. A cathode ray tube (CRT) display apparatus has been used due to a performance and a competitive price. However the CRT display apparatus may be relatively large and lack portability. Therefore a display apparatus such as a plasma display apparatus, a liquid crystal display apparatus, and an organic light emitting display apparatus has been highly regarded due to small size, light weight, and low power-consumption.

As the resolution of the liquid crystal display apparatus increases, improved precision of pattering may also be increased. However, the precision of pattering is limited due to the resolution of a stepper or mask. Additionally, as the structure of the liquid crystal display apparatus becomes more complex, it may be difficult to form a precise pattern on a substrate having uneven thickness.

SUMMARY

Aspects of example embodiments of the present invention relate to a mask for photolithography, a method of manufacturing the mask, a method of manufacturing a substrate using the mask. For example, example embodiments of the present invention relate to a mask for photolithography to manufacture a liquid crystal display apparatus, a method of manufacturing the mask, a method of manufacturing a substrate using the mask.

Aspects of example embodiments of the present invention include a mask for photolithography having improved resolution.

Aspects of example embodiments of the present invention also provide a method of manufacturing the mask.

Aspects of example embodiments of the present invention also provide a method of manufacturing a substrate using the mask.

According to example embodiments of the present invention, a mask for photolithography includes: a transparent substrate; a phase shift pattern on the transparent substrate and configured to change a phase of light; a dielectric layer on the transparent substrate; and a negative refractive-index meta material layer on the dielectric layer.

The phase shift pattern may have a second width and may define an opening having a first width, wherein a pitch may be defined by a sum of the first width and the second width, and the pitch may be less than 4 micrometers.

The pitch may be less than 1 micrometers.

The phase shift pattern may include at least one of chrome oxide nitride (CrOxNy) and molybdenum silicide oxide nitride (MoSiOxNy).

A thickness of the phase shift pattern may be 130 nanometers.

The dielectric layer may include polymethyl methacrylate (PMMA).

A thickness of the dielectric layer may be 40 nanometers.

The negative refractive-index meta material layer may be configured to generate a surface plasmonic resonance or phonon resonance.

A thickness of the negative refractive-index meta material layer may be 30 nanometers.

The mask may further include a second dielectric layer on the negative refractive-index meta material layer.

According to example embodiments of the present invention, in a method of manufacturing a mask for photolithography, the method includes: forming a phase shift pattern on a transparent substrate; forming a dielectric layer on the transparent substrate; and forming a negative refractive-index meta material layer on the dielectric layer.

The phase shift pattern may have a second width and may define an opening having a first width, wherein a pitch may be defined by a sum of the first width and the second width, and the pitch may be less than 4 micrometers.

The phase shift pattern may include at least one of chrome oxide nitride (CrOxNy) and molybdenum silicide oxide nitride (MoSiOxNy).

The method may further include performing a plasma hydrophilic treatment on an upper surface of the phase shift pattern.

The method may further include ashing the dielectric layer.

A thickness of the dielectric layer may be 40 nanometers.

The negative refractive-index meta material layer may include at least one or more of silver, gold, and aluminum.

A thickness of the negative refractive-index meta material layer may be 35 nanometers.

The method may further include providing a second dielectric layer on the negative refractive-index meta material layer.

According to some embodiments of the present invention, in a method of manufacturing a substrate using a mask for photolithography, wherein the mask includes: a transparent substrate; a phase shift pattern on the transparent substrate and configured to change a phase of light; a dielectric layer on the transparent substrate; and a negative refractive-index meta material layer on the dielectric layer, the method includes: arranging a substrate on which a photoresist layer is formed to face the mask; exposing light to the photoresist layer through the mask, wherein the negative refractive-index meta material layer generates surface plasmonic resonance or phonon resonance, the surface plasmonic resonance or phonon resonance are induced to define an evanescence wave which exponentially decays according to a propagation distance of an electromagnetic wave for accurate suppression of light transfer in a photolithography process; and forming a photoresist pattern by developing the photoresist layer using a developer.

According to example embodiments of the present invention, the mask for photolithography includes the dielectric layer and the negative refractive-index meta material layer, so that the mask may have a resolution improvement as a super lens. In addition, the mask includes the phase shift pattern, so that resolution of the mask may be further improved.

In addition, according to the method of manufacturing a substrate using the mask, the upper surface of the phase shift pattern of the mask is treated by plasma hydrophilic treatment, so that quality of the dielectric layer may be improved. In addition, according to the method, thickness of the dielectric layer may be decreased by ashing process of the preliminary dielectric layer, so that desired thickness of the dielectric layer may be obtained.

BRIEF DESCRIPTION OF THE DRAWINGS

The above and other features of the present invention will become more apparent by describing in some detail example embodiments thereof with reference to the accompanying drawings, in which.

DETAILED DESCRIPTION

Hereinafter, the example embodiments of the present invention will be explained in some detail with reference to the accompanying drawings.

Figure 1:
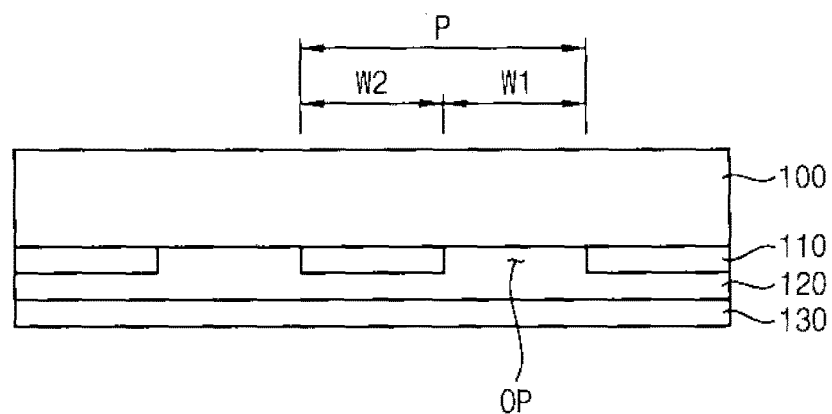
FIG. 1 is a cross-sectional view illustrating a mask for photolithography according to an example embodiment of the present invention.

FIG. 1 is a cross-sectional view illustrating a mask for photolithography according to an example embodiment of the present invention.

Referring to FIG. 1, a mask for photolithography includes a transparent substrate 100, a phase shift pattern 110, a dielectric layer 120 and a negative refractive-index meta material layer 130.

The transparent substrate 100 passes light, and does not change phase of the light. For example, the transparent substrate 100 may include quartz.

The phase shift pattern 110 is arranged on the transparent substrate 100. The phase shift pattern 110 changes phase of light, which passes the phase shift pattern 110. The phase shift pattern 110 may include any suitable phase shift material, such as chrome oxide nitride (CrOxNy), molybdenum silicide oxide nitride (MoSiOxNy), etc. In addition, the phase shift pattern 110 may have various shapes and configurations according to a pattern to form by photolithography process.

The phase shift pattern 110 includes chrome oxide and may have thickness of about 130 nm. Accordingly, the phase shift pattern 110 may change a phase of light having about 365 nm of wavelength as 180° (reversal), and may have about 8% of transmissivity.

The phase shift pattern 110 defines (e.g., is adjacent to) an opening OP (or opening area. A phase of light that passes the opening OP is not changed. The opening OP may have a first width W1, and the phase shift pattern 110 may have a second width W2. The sum of the first width W1 and the second width W2 is same as a pitch P. Each of the first width W1 and the second width W2 may be less than 2 micrometers (μm). In addition, the phase shift pattern 110 may have a more precise pattern, so that each of the first width W1 and the second width W2 may be less than about 500 nanometers (nm). Thus, the pitch P may be less than about 4 μm, or the pitch P may be less than about 1 μm.

The dielectric layer 120 is formed on the transparent substrate 100 on which the phase shift pattern 110 is formed. The dielectric layer 120 may include any suitable dielectric material. For example, the dielectric layer 120 may include polymethyl methacrylate (PMMA).

The dielectric layer 120 may include polymethyl methacrylate (PMMA) and have thickness greater than about 10 nm and smaller than about 500 nm. According to some embodiments, the dielectric layer 120 may include polymethyl methacrylate (PMMA), and have a thickness about 40 nm.

A negative refractive-index meta material layer 130 is formed on the dielectric layer 120. The negative refractive-index meta material layer 130 may be formed by using a metal E-beam evaporate method. For example, the negative refractive-index meta material layer 130 may include a suitable metal or conductive material such as silver, gold, aluminum, and the like. The negative refractive-index meta material layer 130 may have a thickness less than about 150 nm, and according to some embodiments may have a thickness of about 35 nm.

The negative refractive-index meta material layer 130 may generate surface plasmonic resonance or phonon resonance. The surface plasmonic resonance or phonon resonance are induced to define an evanescence wave that exponentially decays according to a propagation distance of an electromagnetic wave and the method uses the decayed evanescence wave phenomenon for accurate suppression of light transfer in a photolithography process.

The mask for photolithography according to the present example embodiment includes the phase shift pattern 110 and the negative refractive-index meta material layer 130. Thus, the mask may have improved resolution.

Figure 2:
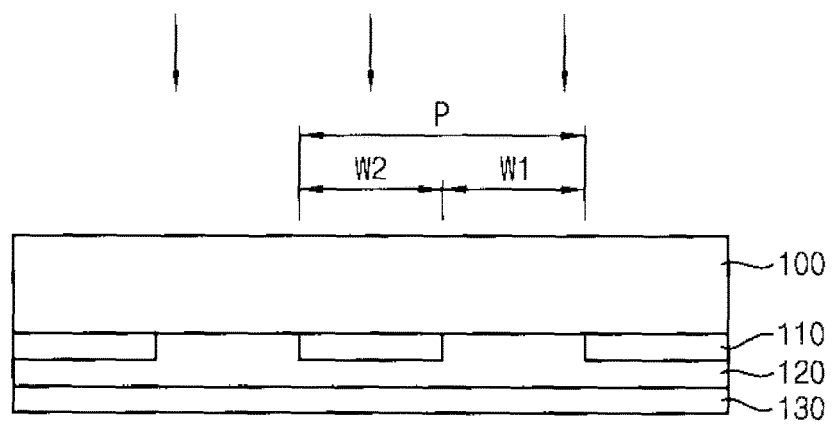
FIGS. 2 and 3 are cross-sectional views illustrating a method of manufacturing a substrate using the mask of FIG. 1.
Figure 2:
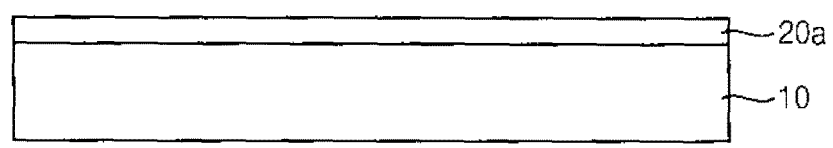
Figure 3:
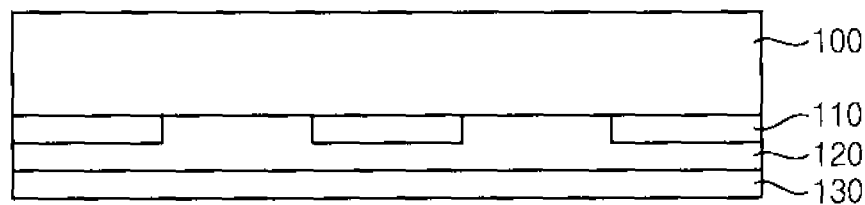
Figure 3:
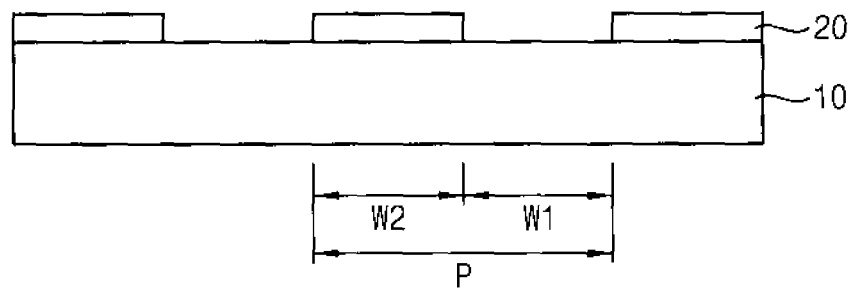

FIGS. 2 and 3 are cross-sectional views illustrating a method of manufacturing a substrate using the mask of FIG. 1.

Referring to FIGS. 2 and 3, a mask for photolithography includes a transparent substrate 100, a phase shift pattern 110, a dielectric layer 120, and a negative refractive-index meta material layer 130. The phase shift pattern 110 defines an opening OP. The opening OP may have a first width W1, and the phase shift pattern 110 may have a second width W2. Sum of the first width W1 and the second width W2 is same as a pitch P.

The mask is arranged or positioned over a substrate 10 to face the substrate 10 (e.g., such that the negative refractive-index meta material layer 130 is closest to the substrate 10 compared to the transparent substrate 100). And then, a photoresist layer 20a on the substrate 10 is exposed to light which passes the mask.

The photoresist layer 20a is formed on the substrate 10. The substrate 10 may be a base substrate or a substrate having a base substrate and a metal pattern on the substrate. For example, the substrate 10 may be a transparent insulation substrate such as a glass substrate or transparent plastic substrate. The metal pattern may include a thin film transistor.

The photoresist layer 20a includes a photoresist composition. The photoresist composition may include a positive photoresist composition in which a portion of the positive photoresist composition that is exposed to light becomes soluble to a developer. For example, the photoresist composition may include an acid generator, a resin with increased alkali solubility due to an acid-catalyzed reaction, an alkali metallic salt, and/or an organic solvent.

In addition, the photoresist composition may include a negative photoresist composition in which a portion of the positive photoresist composition that is not exposed to light becomes soluble to a developer. For example, the photoresist composition may include an ethylencally unsaturated compound, a photoiniciator, thermosetting composition, and/or an organic solvent. In this case, the photoresist pattern may be formed on the contrary to a case of positive photoresist composition.

Light passes the opening OP of the mask, so that the photoresist layer 20a is exposed to the light.

At that time, an exposure apparatus arranged or positioned above the mask supplies the light, and then the light is passed through the mask to the photoresist layer 20a on the substrate 10. Due to plasmonic resonance or phonon resonance generated by the dielectric layer 120 and the negative refractive-index meta material layer 130, an evanescent wave of the light is transmitted to the photoresist layer 20a on the substrate 10.

After that, an exposed portion of the photoresist layer 20a is removed (e.g., by a developer). A photoresist pattern 20 is formed by removing the exposed portion of the photoresist layer 20a. And then, the substrate 10 is partially etched using the photoresist pattern.

And then, remaining photoresist pattern 20 may be removed.

Accordingly, a pattern having the pitch P, the first width W1 and the second width W2 may be formed on the substrate 10.

For example, the pitch P of the mask may be less than about 4 µm or more precisely 1 µm referring to explanation of FIG. 1. Thus, the pitch P of the pattern on the substrate 10 may be less than about 4 µm or more precisely 1 µm.

FIGS. 4 to 7 are cross-sectional views illustrating a method of manufacturing the mask of FIG. 1.

Figure 4:
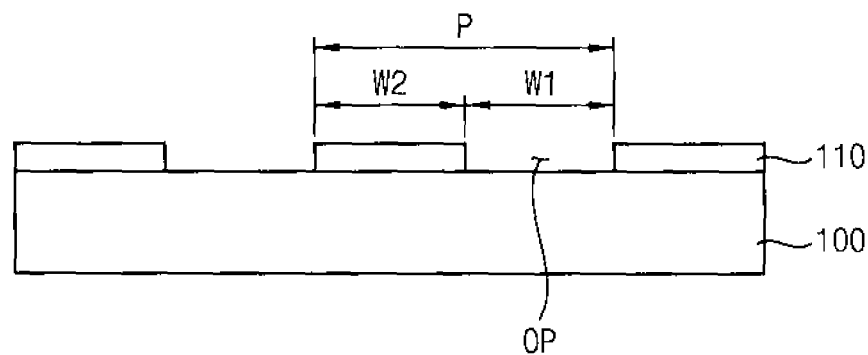
FIGS. 4 to 7 are cross-sectional views illustrating a method of manufacturing the mask of FIG. 1.

Referring to FIG. 4, a phase shift pattern 110 is formed on a transparent substrate 100.

The transparent substrate 100 passes light, and does not change a phase of the light. For example, the transparent substrate 110 may include quartz.

The phase shift pattern 110 changes a phase of light that passes the phase shift pattern 110. The phase shift pattern 110 may include any suitable phase shift material, such as chrome oxide nitride (CrOxNy), molybdenum silicide oxide nitride (MoSiOxNy), etc. In addition, the phase shift pattern 110 may have various shapes, arrangements, or configurations according to a pattern to form by photolithography process. The phase shift pattern 110 may have thickness of about 130 nm.

The phase shift pattern 110 defines an opening OP. The opening OP may have a first width W1, and the phase shift pattern 110 may have a second width W2. The sum of the first width W1 and the second width W2 is same as a pitch P.

And then, an upper surface of the phase shift pattern 110 may be treated by plasma hydrophilic treatment. The plasma hydrophilic treatment may be performed by any suitable technique known in the art.

Figure 5:
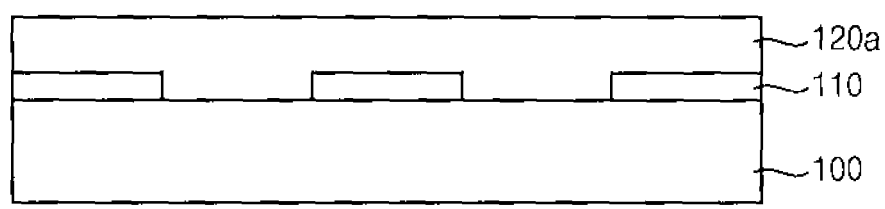

Referring to FIG. 5, a preliminary dielectric layer 120a is formed on the transparent substrate 100 on which the phase shift pattern 110 is formed. The preliminary dielectric layer 120a may include dielectric material. For example, the dielectric layer 120 may include polymethyl methacrylate (PMMA).

Figure 6:
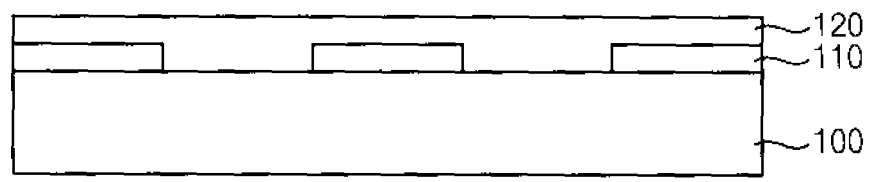

Referring to FIG. 6, a dielectric layer 120 is formed by removing an upper portion of the preliminary dielectric layer 120a. For example, a thickness of the preliminary dielectric layer 120a may be decreased by an ashing process. Accordingly, the dielectric layer 120 is formed. According to some embodiments, the dielectric layer 120 may have thickness no less than about 10 nm and no more than 500 nm. According to some embodiments, the dielectric layer 120 may have a thickness of about 40 nm.

Figure 7:
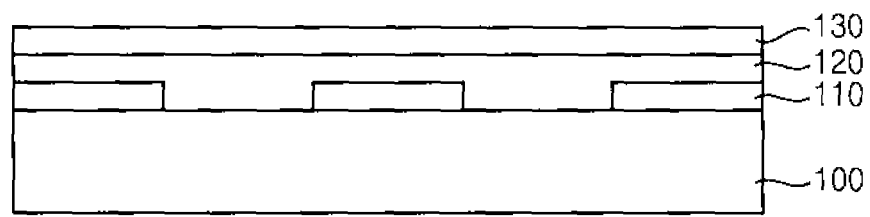

Referring to FIG. 7, a negative refractive-index meta material layer 130 made of an appropriate metal is formed on the first dielectric layer 120 using a suitable deposition method, for example, by way of an E-beam evaporation method. The negative refractive-index meta material layer 130 may include a metal or conductive material such as silver, gold, and/or aluminum.

Figure 8:
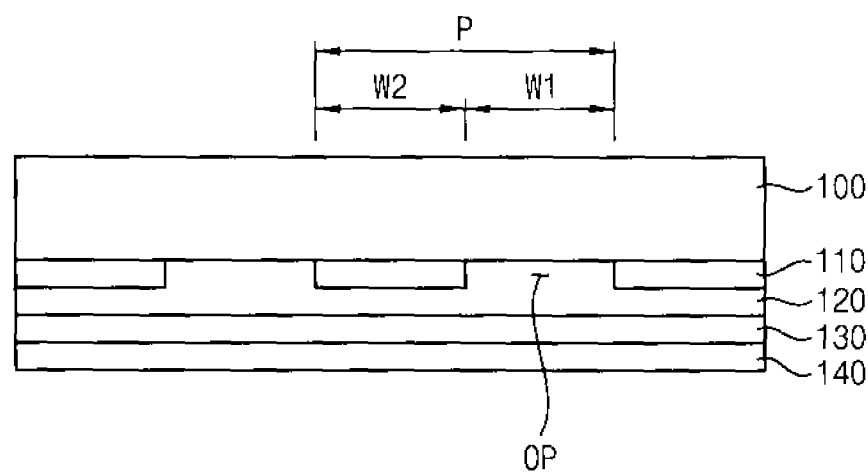
FIG. 8 is a cross-sectional view illustrating a mask for photolithography according to an example embodiment of the present invention.

FIG. 8 is a cross-sectional view illustrating a mask for photolithography according to an example embodiment of the present invention.

Referring to FIG. 8, a mask for photolithography includes a transparent substrate 100, a phase shift pattern 110, a first dielectric layer 120, a negative refractive-index meta material layer 130, and a second dielectric layer 140.

The transparent substrate 100 passes light, and does not change phase of the light. For example, the transparent substrate 110 may include quartz.

The phase shift pattern 110 is arranged or formed on the transparent substrate 100. The phase shift pattern 110 changes a phase of light that passes through the phase shift pattern 110. The phase shift pattern 110 may include any suitable phase shift material, such as chrome oxide nitride (CrOxNy), molybdenum silicide oxide nitride (MoSiOxNy), etc. In addition, the phase shift pattern 110 may have various shapes according to a pattern to form by photolithography process.

The phase shift pattern 110 includes chrome oxide and may have thickness of about 130 nm. Accordingly, the phase shift pattern 110 may change a phase of light having about 365 nm of wavelength as 180° (reversal), and has about 8% of transmissivity.

The phase shift pattern 110 defines an opening OP. Phase of light that passes the opening OP is not changed. The opening OP may have a first width W1, and the phase shift pattern 110 may have a second width W2. The sum of the first width W1 and the second width W2 is same as a pitch P. Each of the first width W1 and the second width W2 may be less than 2 µm. In addition, the phase shift pattern 110 may have a more precise pattern, so that each of the first width W1 and the second width W2 may be less than about 500 nm. Thus, the pitch P may be less than about 4 µm, or the pitch P may be less than about 1 µm.

The first dielectric layer 120 is arranged on the substrate 100 on which the phase shift pattern 110 is arranged. The first dielectric layer 120 may include a suitable dielectric material. For example, the first dielectric layer 120 may include polymethyl methacrylate (PMMA).

The first dielectric layer 120 may include polymethyl methacrylate (PMMA) and have thickness greater than about 10 nm and smaller than about 500 nm. According to some embodiments, the first dielectric layer 120 may include polymethyl methacrylate (PMMA), and have a thickness about 40 nm.

The negative refractive-index meta material layer 130 is arranged on the first dielectric layer 120. The negative refractive-index meta material layer 130 may be formed using a suitable deposition method, for example, by using a metal E-beam evaporate method. For example, the negative refractive-index meta material layer 130 may include a metal or conductive material such as silver, gold, aluminum, and the like. The negative refractive-index meta material layer 130 may have a thickness less than about 150 nm, and according to some embodiments, may have a thickness of about 35 nm.

The negative refractive-index meta material layer 130 may generate surface plasmonic resonance or phonon resonance. The surface plasmonic resonance or phonon resonance are induced to define an evanescence wave which exponentially decays according to a propagation distance of an electromagnetic wave and the method uses the decayed evanescence wave phenomenon for accurate suppression of light transfer in a photolithography process.

The second dielectric layer 140 is arranged on the negative refractive-index meta material layer 130. The second dielectric layer 140 may include a suitable dielectric material. For example, the second dielectric layer 140 may include polymethyl methacrylate (PMMA).

Figure 9:
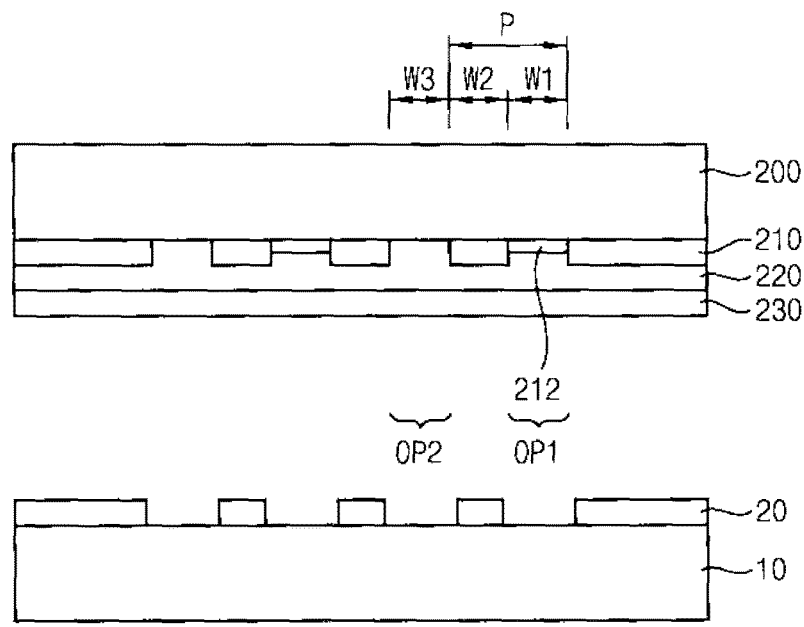
FIG. 9 is a cross-sectional view illustrating a method of manufacturing a substrate using a mask for photolithography according to an example embodiment of the present invention.

FIG. 9 is a cross-sectional view illustrating a method of manufacturing a substrate using a mask for photolithography according to an example embodiment of the present invention.

Referring to FIG. 9, a mask for photolithography includes a transparent substrate 200, a light blocking pattern 210, a phase shift pattern 212, a dielectric layer 220, and a negative refractive-index meta material layer 230.

The transparent substrate 200 passes light, and does not change phase of the light. For example, the transparent substrate 200 may include quartz.

The light blocking pattern 210 is arranged on the transparent substrate 200. The light blocking pattern 210 may include light blocking material. For example, the light blocking pattern 210 may include chrome (Cr). The light blocking pattern 210 defines a first opening OP1 having a first width W1 and a second opening OP2 having a third width W3. The light blocking pattern 210 has a second width W2. The sum of the first width W1 and the second width W2 is same as a pitch P.

The phase shift pattern 212 has the first width W1 and is arranged in the first opening OP1 which is defined by the light blocking pattern 210. The phase shift pattern 212 changes a phase of light which passes through the phase shift pattern 212. The phase shift pattern 212 may include a suitable phase shift material, such as chrome oxide nitride (CrOxNy), molybdenum silicide oxide nitride (MoSiOxNy), etc.

Each of the first width W1, the second width W2, and the third width W3 may be less than about 2 μm. In addition, the mask may have a more precise pattern, such that each of the first width W1 and the second width W2 may be less than about 500 nm. Thus, the pitch P may be less than about 4 μm, or the pitch P may be less than about 1 μm.

The dielectric layer 220 is arranged on the transparent substrate 200 on which the light blocking pattern 210 and the phase shift pattern 212 are arranged. The dielectric layer 220 may include a suitable dielectric material. For example, the dielectric layer 220 may include polymethyl methacrylate (PMMA).

The negative refractive-index meta material layer 230 is arranged on the dielectric layer 220. The negative refractive-index meta material layer 230 may be formed by using a metal E-beam evaporate method. For example, the negative refractive-index meta material layer 230 may include a metal or conductive material such as silver, gold, aluminum, and the like.

Hereinafter, a method of manufacturing a substrate using the mask will be described.

The mask is arranged over a substrate 10 to face the substrate 10. And then, a photoresist layer on the substrate 10 is exposed by light that passes through the mask.

The photoresist layer is formed on the substrate 10. The substrate 10 may be a base substrate or a substrate having a base substrate and a metal pattern on the substrate. For example, the substrate 10 may be a transparent insulation substrate such as a glass substrate or transparent plastic substrate. The metal pattern may include a thin film transistor.

The photoresist layer includes a photoresist composition. The photoresist composition may include a positive photoresist composition in which a portion of the positive photoresist composition that is exposed to light becomes soluble to a developer. For example, the photoresist composition may include an acid generator, a resin with increased alkali solubility due to an acid-catalyzed reaction, an alkali metallic salt, and an organic solvent.

In addition, the photoresist composition may include a negative photoresist composition in which a portion of the positive photoresist composition that is not exposed to light becomes soluble to a developer. For example, the photoresist composition may include an ethylencally unsaturated compound, a photoiniciator, a thermosetting composition, and/or an organic solvent. In this case, the photoresist pattern may be formed on the contrary to a case of positive photoresist composition.

Light passes through the opening OP of the mask, so that the photoresist layer is exposed to the light.

At that time, an exposure apparatus positioned above the mask supplies the light, and then the light is passed through the mask to the photoresist layer on the substrate 10. Due to plasmonic resonance or phonon resonance generated by the dielectric layer 220 and the negative refractive-index meta material layer 230, an evanescent wave of the light is transmitted to the photoresist layer on the substrate 10.

After that, an exposed portion of the photoresist layer is removed (e.g., by a developer). A photoresist pattern 20 is formed by removing the exposed portion of the photoresist layer. And then, the substrate 10 is partially etched using the photoresist pattern 20.

And then, the remaining photoresist pattern may be removed.

Accordingly, a pattern having the pitch P, the first width W1 and the second width W2 may be formed on the substrate 10.

Figure 10:
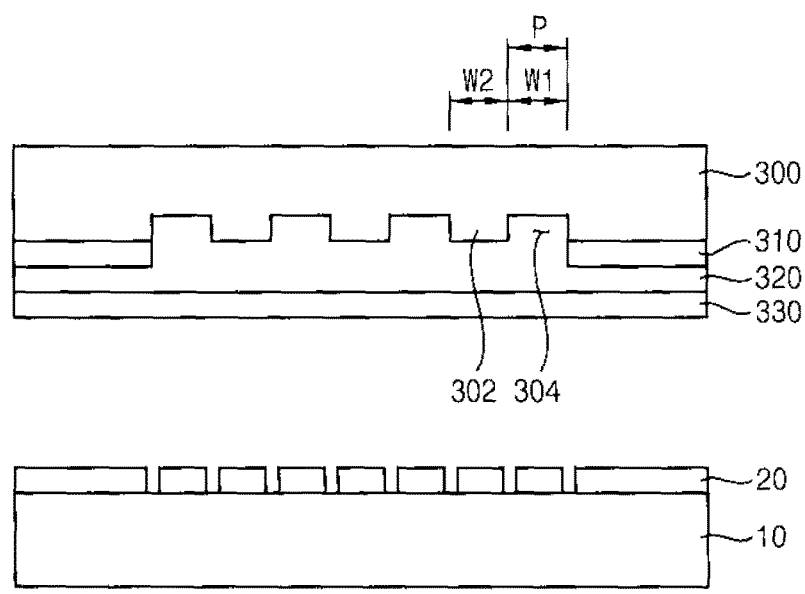
FIG. 10 is a cross-sectional view illustrating a method of manufacturing a substrate using a mask for photolithography according to an example embodiment of the present invention.

FIG. 10 is a cross-sectional view illustrating a method of manufacturing a substrate using a mask for photolithography according to an example embodiment of the present invention.

Referring to FIG. 10, a mask for photolithography includes a transparent substrate 300, a light blocking pattern 310, a dielectric layer 320, and a negative refractive-index meta material layer 330.

The transparent substrate 200 passes light, and does not change a phase of the light. For example, the transparent substrate 200 may include quartz.

The light blocking pattern 210 is arranged on the transparent substrate 200. The light blocking pattern 210 may include a suitable light blocking material.

A convex portion 302 and a concave portion 304 are formed on the transparent substrate 300 where the light blocking pattern 210 is not arranged. The concave portion 304 has a first width W1, and the convex portion 302 has a second width W2. A pattern corresponding to the first width W1 is formed on a substrate, so that a pitch P may be substantially same as the first width W1.

The dielectric layer 320 is arranged on the transparent substrate 300 on which the light blocking pattern 310 is arranged. The dielectric layer 320 may include a suitable dielectric material. For example, the dielectric layer 320 may include polymethyl methacrylate (PMMA).

The negative refractive-index meta material layer 330 is arranged on the dielectric layer 320. The negative refractive-index meta material layer 330 may be formed using a suitable deposition method, for example, by using a metal E-beam evaporate method. For example, the negative refractive-index meta material layer 330 may include a metal or conductive material such as silver, gold, aluminum, and the like.

Hereinafter, a method of manufacturing a substrate using the mask will be described.

The mask is arranged over a substrate 10 to face the substrate 10. And then, a photoresist layer on the substrate 10 is exposed by light which passes through the mask.

An exposure apparatus positioned above the mask supplies the light, and then the light is passed through the mask to the photoresist layer on the substrate 10. Due to plasmonic resonance or phonon resonance generated by the dielectric layer 320 and the negative refractive-index meta material layer 330, an evanescent wave of the light is transmitted to the photoresist layer on the substrate 10.

The photoresist layer includes a photoresist composition. The photoresist composition may include a positive photoresist composition in which a portion of the positive photoresist composition that is exposed to light becomes soluble to a developer. For example, the photoresist composition may include an acid generator, a resin which with increased alkali solubility due to an acid-catalyzed reaction, an alkali metallic salt, and/or an organic solvent.

In addition, the photoresist composition may include a negative photoresist composition in which a portion of the positive photoresist composition that is not exposed to light becomes soluble to a developer. For example, the photoresist composition may include ethylencally unsaturated compound, photoiniciator, thermosetting composition and organic solvent. In this case, the photoresist pattern may be formed on the contrary to a case of positive photoresist composition.

After that, an exposed portion of the photoresist layer is removed (e.g., by a developer). A photoresist pattern 20 is formed by removing the exposed portion of the photoresist layer. And then, the substrate 10 is partially etched using the photoresist pattern 20.

And then, the remaining photoresist pattern may be removed.

Accordingly, a pattern corresponding to the boundary of the convex portion 302 and the concave portion 304 of the mask may be formed. Thus, the pattern corresponding to the pitch P may be formed.

According to example embodiments of the present invention, the mask for photolithography includes the dielectric layer and the negative refractive-index meta material layer, so that the mask may have a resolution improvement as a super lens. In addition, the mask includes the phase shift pattern, so that resolution of the mask may be further improved.

In addition, according to the method of manufacturing a substrate using the mask, the upper surface of the phase shift pattern of the mask is treated by plasma hydrophilic treatment, so that quality of the dielectric layer may be improved. In addition, according to the method, thickness of the dielectric layer may be decreased by an ashing process of the preliminary dielectric layer, so that a desired thickness of the dielectric layer may be obtained.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and aspects of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims, and their equivalents. Aspects of embodiments of the present invention are defined by the following claims, with equivalents of the claims to be included therein.

What is claimed is:

1. A mask for photolithography comprising:
    a transparent substrate;
    a light blocking material across the transparent substrate comprising a plurality of first openings and a plurality of second openings spaced apart from the first opening;
    a phase shift pattern on the transparent substrate and configured to change a phase of light, wherein the phase shift pattern is located in the plurality of first openings and not located in the plurality of second openings;
    a dielectric layer on the transparent substrate; and
    a negative refractive-index meta material layer on the dielectric layer.

2. The mask of claim 1, wherein a portion of the light blocking material has a second width and the first openings have a first width,
    wherein a pitch is defined by a sum of the first width and the second width, and
    the pitch is less than 4 micrometers.

3. The mask of claim 2, wherein the pitch is less than 1 micrometers.

4. The mask of claim 1, wherein the phase shift pattern comprises at least one of chrome oxide nitride (CrOxNy) and molybdenum silicide oxide nitride (MoSiOxNy).

5. The mask of claim 4, wherein a thickness of the phase shift pattern is 130 nanometers.

6. The mask of claim 4, wherein the dielectric layer comprises polymethyl methacrylate (PMMA).

7. The mask of claim 4, wherein a thickness of the dielectric layer is 40 nanometers.

8. The mask of claim 1, wherein the negative refractive-index meta material layer is configured to generate a surface plasmonic resonance or phonon resonance.

9. The mask of claim 8, wherein a thickness of the negative refractive-index meta material layer is 30 nanometers.

10. The mask of claim 1, further comprising a second dielectric layer on the negative refractive-index meta material layer.

11. A method of manufacturing a mask for photolithography, the method comprising:
forming a light blocking material across a transparent substrate;
forming a plurality of first openings and a plurality of second openings spaced apart from the first opening in the light blocking material;
forming a phase shift pattern on the transparent substrate in the first openings and not in the second openings;
forming a dielectric layer on the transparent substrate; and
forming a negative refractive-index meta material layer on the dielectric layer.

12. The method of claim 11, wherein a portion of the light blocking material has a second width and the first openings have a first width,
wherein a pitch is defined by a sum of the first width and the second width, and
the pitch is less than 4 micrometers.

13. The method of claim 12, wherein the phase shift pattern comprises at least one of chrome oxide nitride (CrOxNy) and molybdenum silicide oxide nitride (MoSiOxNy).

14. The method of claim 13, further comprising performing a plasma hydrophilic treatment on an upper surface of the phase shift pattern.

15. The method of claim 14, further comprising ashing the dielectric layer.

16. The method of claim 15, wherein a thickness of the dielectric layer is 40 nanometers.

17. The method of claim 11, wherein the negative refractive-index meta material layer comprises at least one or more of silver, gold, and aluminum.

18. The method of claim 11, wherein a thickness of the negative refractive-index meta material layer is 35 nanometers.

19. The method of claim 18, further comprising providing a second dielectric layer on the negative refractive-index meta material layer.

20. A method of manufacturing a substrate using a mask for photolithography, wherein the mask comprises:
a transparent substrate;
a light blocking material across the transparent substrate comprising a plurality of first openings and a plurality of second openings spaced apart from the first opening;
a phase shift pattern on the transparent substrate and configured to change a phase of light, wherein the phase shift pattern is located in the plurality of first openings and not located in the plurality of second openings;
a dielectric layer on the transparent substrate; and
a negative refractive-index meta material layer on the dielectric layer, the method comprising:
arranging the substrate on which a photoresist layer is formed to face the mask;
exposing light to the photoresist layer through the mask, wherein the negative refractive-index meta material layer generates surface plasmonic resonance or phonon resonance, the surface plasmonic resonance or phonon resonance are induced to define an evanescence wave which exponentially decays according to a propagation distance of an electromagnetic wave for accurate suppression of light transfer in a photolithography process; and
forming a photoresist pattern by developing the photoresist layer using a developer.

* * * * *